United States Patent
Vanderpool et al.

(10) Patent No.: US 7,235,843 B2
(45) Date of Patent: Jun. 26, 2007

(54) IMPLANTING CARBON TO FORM P-TYPE SOURCE DRAIN EXTENSIONS

(75) Inventors: Aaron O. Vanderpool, Gilbert, AZ (US); Mitchell C. Taylor, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/325,864

(22) Filed: Jan. 5, 2006

(65) Prior Publication Data

US 2006/0113570 A1 Jun. 1, 2006

Related U.S. Application Data

(62) Division of application No. 10/789,851, filed on Feb. 26, 2004, now Pat. No. 7,015,108.

(51) Int. Cl.
*H01L 29/78* (2006.01)

(52) U.S. Cl. .............................. 257/336; 257/E29.278
(58) Field of Classification Search ................ 257/336, 257/E29.278
See application file for complete search history.

(56) References Cited

U.S. PATENT DOCUMENTS

| 6,303,450 | B1 * | 10/2001 | Park et al. ................... 438/300 |
| 6,830,980 | B2 * | 12/2004 | Mansoori et al. ............ 438/308 |
| 2003/0207542 | A1 * | 11/2003 | Chidambaram et al. .... 438/305 |
| 2005/0151172 | A1 * | 7/2005 | Takemura et al. .......... 257/288 |

* cited by examiner

*Primary Examiner*—Asok Kumar Sarkar
(74) *Attorney, Agent, or Firm*—Trop, Pruner & Hu, P.C.

(57) ABSTRACT

The use of a carbon implant, in addition to the conventional fluorine implant, may significantly reduce the transient enhanced diffusion in P-type source drain extension regions. As a result, resistivity may be reduced, and dopant density may be increased, increasing current drive in some embodiments.

2 Claims, 3 Drawing Sheets

IMPLANTING CARBON TO FORM P-TYPE SOURCE DRAIN EXTENSIONS

This application is a divisional of U.S. patent application Ser. No. 10/789,851, filed on Feb. 26, 2004 now U.S. Pat. No. 7,015,108.

BACKGROUND

This invention relates generally to the fabrication of integrated circuits.

In the fabrication of integrated circuits, a gate electrode may be utilized as a mask for forming source and drain junctions. The source and drain junctions may include an extension or tip which extends from the region underneath the gate electrode to a deeper source drain region.

In connection with P-type transistors, boron is commonly utilized for the deeper source drain junction. Boron diffuses more than N-type impurities because of transient enhanced diffusion (TED). The small size of the boron atom and its tendency to diffuse through interstitial motion results in increased diffusion. The transient enhanced diffusion of boron results in deeper and less highly doped P-typed source drain regions.

It is important to increase the doping density of the source drain extensions as device geometries shrink. This increase in density allows the P-type source drain extension resistivity to be reduced. Reducing the resistivity of the P-type extensions allows transistor drive current densities to scale appropriately so long as the dose can be successfully activated during an anneal. The drive currents are directly related to the speed of the resulting transistors.

Conventionally, transient enhanced diffusion is counteracted by implanting fluorine just below the P-type source drain extension implant. During the first few milliseconds of activation anneal, the fluorine ties up the boron briefly, limiting its interstitial diffusion. This limiting of interstitial diffusion has the effect of reducing the boron diffusion by 10 to 20 percent after activation. This reduction of boron diffusion increases the dopant density and reduces the resistivity of the layer.

However, in order to further scale transistors, to improve the dopant density and resistivity, it would be desirable to further reduce the transient enhanced diffusion.

DETAILED DESCRIPTION

Figure 1:
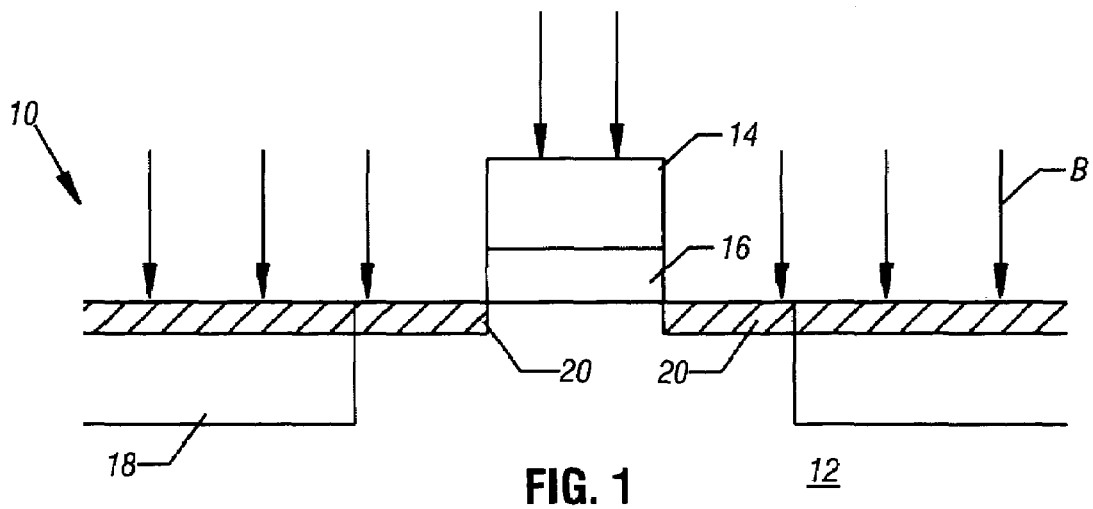
FIG. 1 is a schematic, enlarged cross sectional view of one embodiment at an early stage of manufacture.

Referring to FIG. 1, a P-type transistor structure 10 may include a deeper source drain region 18 and an implanted, shallower source drain region, tip or source drain extension 20 which may be formed, at least in part, by a boron implant. The implant is undertaken before the deeper regions 18 are formed, using the gate electrode 14 as a mask. The gate electrode 14 is formed over a dielectric layer 16 on a semiconductor substrate 12 in one embodiment of the present invention.

Figure 2:
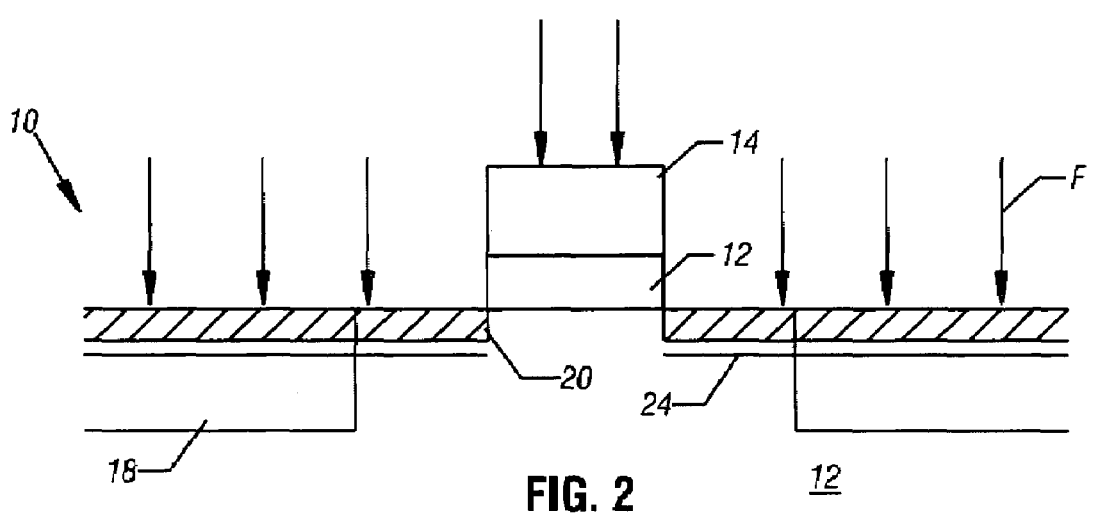
FIG. 2 is a schematic, enlarged cross sectional view corresponding to FIG. 1 at a subsequent stage of manufacture in accordance with one embodiment of the present invention.

As shown in FIG. 2, a deeper fluorine implant may be utilized to form the implanted region 24. The region 24 extends to a depth slightly below the depth of the boron source drain extension implant 20.

Figure 3:
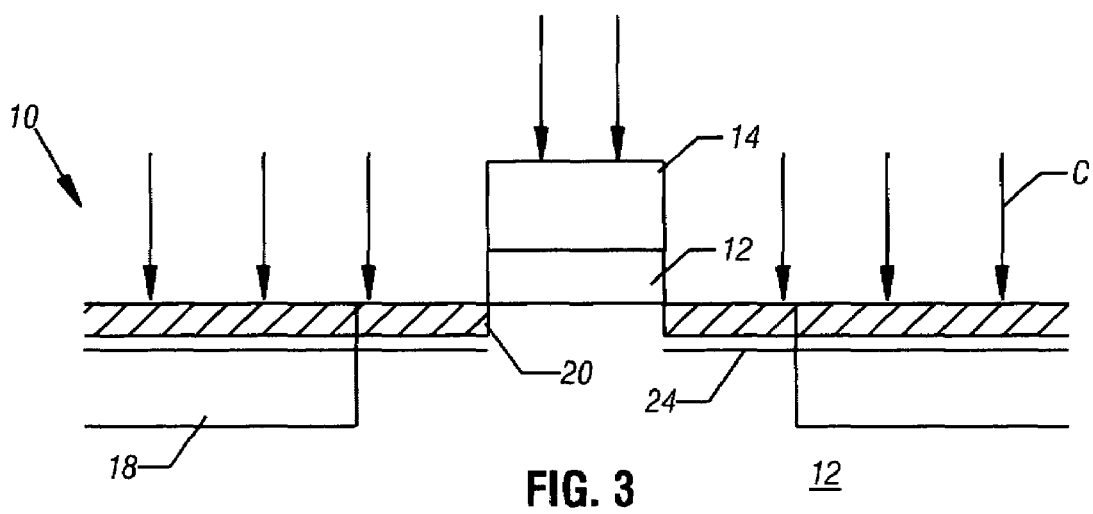
FIG. 3 is a schematic, enlarged cross sectional view of one embodiment of the present invention at a subsequent stage of manufacture.

Next, a carbon implant may be utilized to form the implanted region 24 with both carbon and fluorine, as shown in FIG. 3. In some embodiments, transient enhanced diffusion in the P-type source drain extension is reduced when carbon is implanted in the same area as the fluorine at the same depth as or below the P-type source drain extension implant. In some embodiments as much as a 35 to 40 percent reduction in transient enhanced diffusion may be achieved. In some embodiments, the carbon species is implanted to the same depth as the fluorine species is normally implanted in the P-type source drain extension. As a result, the peak concentration of carbon and fluorine is immediately below the peak concentration of the boron implant in one embodiment.

Figure 4:
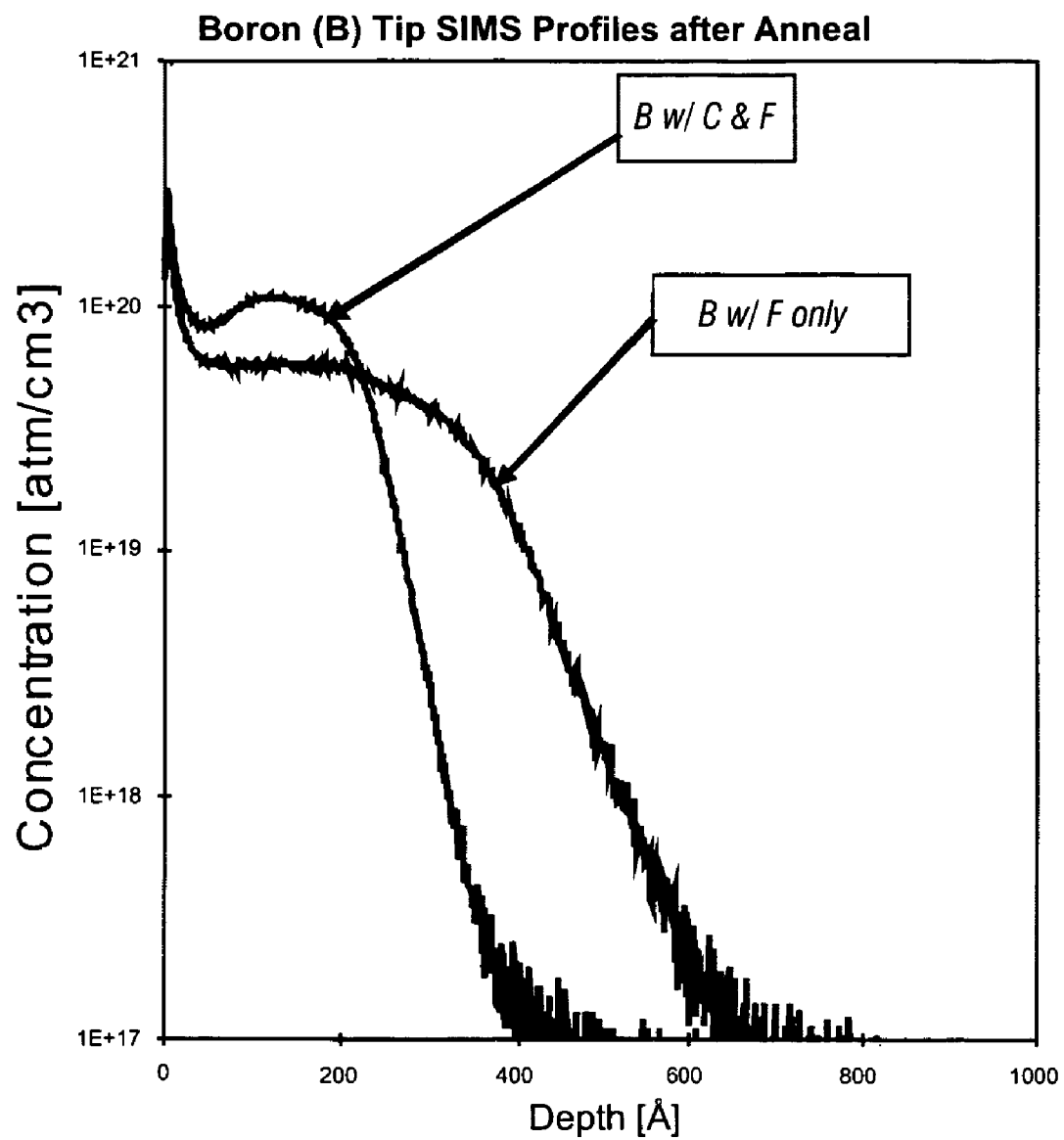
FIG. 4 is a concentration versus depth profile in accordance with one embodiment of the present invention.

Referring to FIG. 4, implantation of carbon in conjunction with the standard fluorine implant significantly reduces the diffusion of the P-type boron source drain extension implant. For example, in FIG. 4, the profile labeled "B w/C & F" shows a dopant profile of an annealed boron implant that had both carbon and fluorine implants slightly deeper than the boron implant. The presence of both the carbon and fluorine reduces the boron depth to 323 Angstroms at a concentration of 1E18 ions per $cm^3$.

The "B w/F only" profile had only a boron and fluorine implant. Note the deeper junction profile of the boron with fluorine protocol, demonstrating the increased TED. These Secondary Ion Mass Spectrometry (SIMS) profiles are all of the same Boron P-type extension implant after the activation spike anneal on a rapid thermal annealing tool.

In some embodiments, the carbon implant may be done at relatively low energy of about 6 KeV or less with a dose of about 1E15 $ions/cm^2$. The fluorine implant may be at low energy, for example, of about 10 KeV or less with a dose of about 1E15 $ions/cm^2$, in some embodiments of the present invention.

Figure 5:
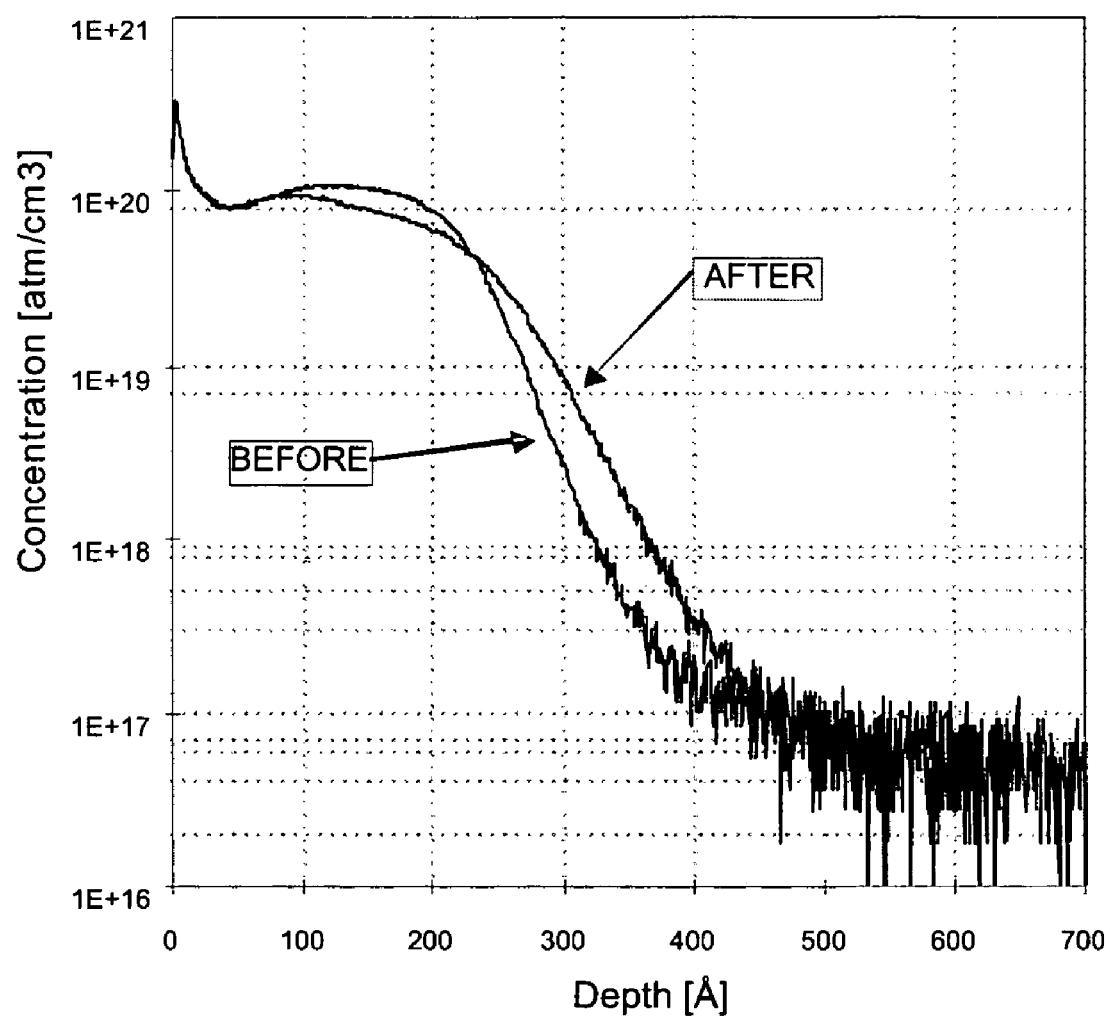
FIG. 5 is a concentration versus depth profile in accordance with one embodiment of the present invention.

The reduction of transient enhanced diffusion may also be enhanced if an Arsenic Halo implant occurs before the P-type source drain extension implants. Referring to FIG. 5, the SIMS profile labeled "after" indicates the Arsenic Halo implant was done after the extension implants. The profile labeled "before" indicates the Arsenic Halo implant was done prior to the extension implant. Decreased TED may be achieved by reversing the normal step order in some embodiments.

In some embodiments, germanium and/or silicon implants may also be used with boron, fluorine, and carbon implants.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a P-type transistor having a source drain extension including fluorine and boron and wherein fluorine is deeper than boron.

2. The circuit of claim 1 wherein the source and drain extension further includes carbon and is deeper than said boron.

* * * * *